(12) United States Patent
Mostafazadeh et al.

(10) Patent No.: US 7,002,241 B1
(45) Date of Patent: Feb. 21, 2006

(54) PACKAGING OF SEMICONDUCTOR DEVICE WITH A NON-OPAQUE COVER (75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/248,725

(22) Filed: Feb. 12, 2003

(51) Int. Cl.
*H01L 21/44* (2006.01)
(52) U.S. Cl. .................. 257/678; 257/434; 257/749; 257/794; 257/737; 257/704; 257/432; 257/433
(58) Field of Classification Search ............... 257/434, 257/239, 678, 794, 737, 704, 749, 432
See application file for complete search history.

(56) References Cited

U.S. PATENT DOCUMENTS

| | | | |
|---|---|---|---|
| 6,428,650 B1 * | 8/2002 | Chung | 156/250 |
| 6,492,699 B1 * | 12/2002 | Glenn et al. | 257/433 |
| 6,667,543 B1 * | 12/2003 | Chow et al. | 257/676 |
| 6,670,222 B1 * | 12/2003 | Brodsky | 438/118 |
| 2003/0098912 A1 * | 5/2003 | Hosokai et al. | |
| 2004/0017537 A1 * | 1/2004 | Magana et al. | 349/187 |

OTHER PUBLICATIONS

"ShellOP Process Flow," Shellcase Wafer Level Packaging, Oct. 2001, 9 pages.
"ShellOP," downloaded from http://www.shellcase.com/pages/products.asp on Nov. 19, 2002, 3 pages.
"ShellBGA Process Flow," Shellcase Wafer Level Packaging, Nov. 2001, 12 pages.
"Dual Inline Package," downloaded from http://www.tpub.com/neets/book14/57g.htm, on Nov. 15, 2002, 5 pages.
"An Innovative Approach to Wafer-Level MEMS packaging," downloaded from: http://solidstate.articles.printthis.clickability.com on Nov. 19, 2002, 4 pages.
"Packaging Techniques," downloaded from: http://www.tpub.com/neets/book14/57f.htm on Nov. 15, 2002.

* cited by examiner

*Primary Examiner*—Eddie Lee
*Assistant Examiner*—Junghwa Im
(74) *Attorney, Agent, or Firm*—Beyer Weaver & Thomas, LLP (57) ABSTRACT

Packages of semiconductor devices with non-opaque covers and methods for making the packages. The invention allows an encapsulant to be used with a non-opaque cover. By ensuring the cover is attached to a die in such a way as to expose bonding pads while sealing in the imaging portion of the die, the die can be electrically connected to a substrate and then encapsulated. Since the imaging portion is sealed, the encapsulant cannot get underneath the glass. By ensuring the encapsulant is not filled beyond the glass, encapsulant cannot get over the glass either.

16 Claims, 11 Drawing Sheets

PACKAGING OF SEMICONDUCTOR DEVICE WITH A NON-OPAQUE COVER

BACKGROUND OF THE INVENTION

1. Field of the Invention

The present invention relates generally to semiconductor packaging and more specifically the packaging of semiconductors devices that include optical components.

2. Description of the Related Art

There are a wide variety of digital imaging devices that are currently commercially available. The imagers used in these devices typically take the form of an integrated circuit having a charge-coupled devices (CCD) and/or CMOS imagers. CCDs and CMOS imagers are specially made integrated circuits that respond to light. CCDs are used to capture image data in devices such as telescopes, bar code readers, digital still and video cameras and scanners.

Packaging is an important and often costly aspect of the integrated circuit manufacturing process. Historically, a wide variety of techniques have been used to package integrated circuits. In an effort to reduce the costs associated packaging, there have been efforts to handle some of the packaging process steps at the wafer level. That is, before the wafer is diced into individual integrated circuit devices. One wafer level packaging approach that has been used in packaging integrated circuits having optical components is the chip-scale "ShellOP" type packaging technology developed by Shellcase Ltd. of Israel. The ShellOP package is a wafer level packaging technology where substantially all of the packaging process occurs on the IC wafer directly, instead of being a separate process after the wafer is diced.

Figure 1:
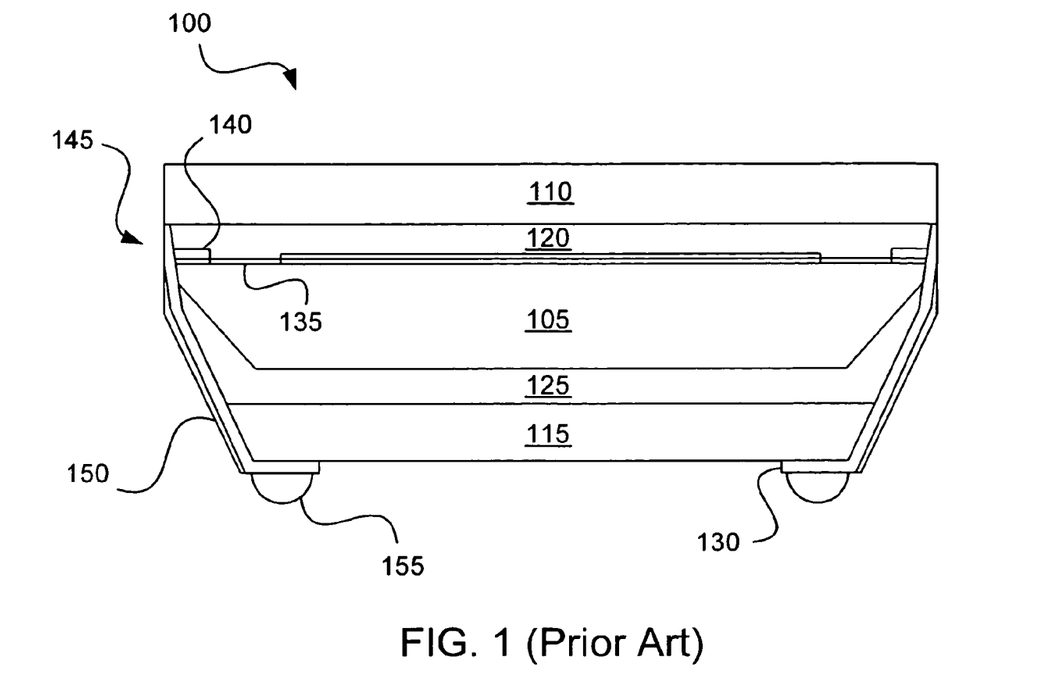
FIG. 1 is a cross sectional view of a prior art ShellOP package.

A cross-sectional view of a typical ShellOP package is shown by way of example in FIG. 1. As seen therein, IC package 100 is an optically active device based on the ShellOP packaging design. The packaging process employs standard wafer processing techniques such as grinding, photolithography, etching, metal deposition, plating, and dicing. Unlike many packaging methods, the Shellcase process requires no lead frames, or wire bonding. The optical package comprises semiconductor bulk 105, which is held in placed in between a top glass plate 110 and a lower glass plate 115 by epoxy 120 and 125, respectively. Inverted external leads 130 are electrically connected to die terminals 135 by trace contacts 140 at junctions 145. Junction 145 is sometimes referred to as a T-junction, and contact 140 as a T-junction contact. External leads 130 are coated with a protective solder-mask 150. Solder-mask 150 is a dielectric material that electrically isolates leads 130 from external contact, and protects the lead surface against corrosion. Contacts 155 are attached to the bottom end of leads 130, and are suitable for printed circuit board (PCB) mounting by known methods. Contacts 155 may be formed by known methods such as solder-balls or plating, and may be suitably shaped for PCB mounted.

Although the ShellOP and other existing packaging processes have proven to be useful, there are continuing efforts to provide even better package designs and packaging processes for integrated circuits having imaging sensors incorporated thereon.

SUMMARY OF THE INVENTION

The present invention provides packages and methods for making the packages. In one embodiment, a semiconductor device includes a die, a non-opaque cover, a substrate and an encapsulant. The substrate, which is positioned below the die, has contacts that are in electrical contact with the die. The non-opaque cover is positioned above the die. The encapsulant is molded around the die and the non-opaque cover, ensuring the position of the die is held relative to the position of the non-opaque cover.

The encapsulant should not obstruct the top surface of the non-opaque cover. One way of preventing the obstruction is by ensuring the encapsulant does not go beyond the height of the non-opaque cover, or any protective films thereon.

Depending on the style of package, the substrate can be a lead frame, a leadless lead frame, a ball grid array or any number of other products. Typically, the substrate will have electrically conductive traces and contact pads, which are electrically connected to the die via bonding wires. If bonding wires are used, the encapsulant can fully encapsulate the bonding wires.

In another embodiment, a plurality of dice are provided, each die having a non-opaque cover. The dice are then electrically connected to a portion of a substrate. The dice and the non-opaque covers are then encapsulated such that the non-opaque cover is unobstructed. Finally, the substrate is singulated.

BRIEF DESCRIPTION OF THE DRAWINGS

The invention may best be understood by reference to the following description taken in conjunction with the accompanying drawings in which.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The present invention allows an optical semiconductor device to be fabricated in a cost-effective manner. Generally, a non-opaque cover (e.g. glass) is attached to a die in such a way as to expose bonding pads while sealing in the imaging portion of the die. With this arrangement, the covered die can be electrically connected to a substrate and then encapsulated. Since the imaging portion is sealed, the encapsulant cannot get underneath the glass. By ensuring the encapsulant is not filled beyond the glass, encapsulant cannot get over the glass either. The encapsulant thereby serves the purpose of fixing the position of the die, the glass cover, and the electrical connections without obstructing the imaging portion of the die.

Figure 2A:
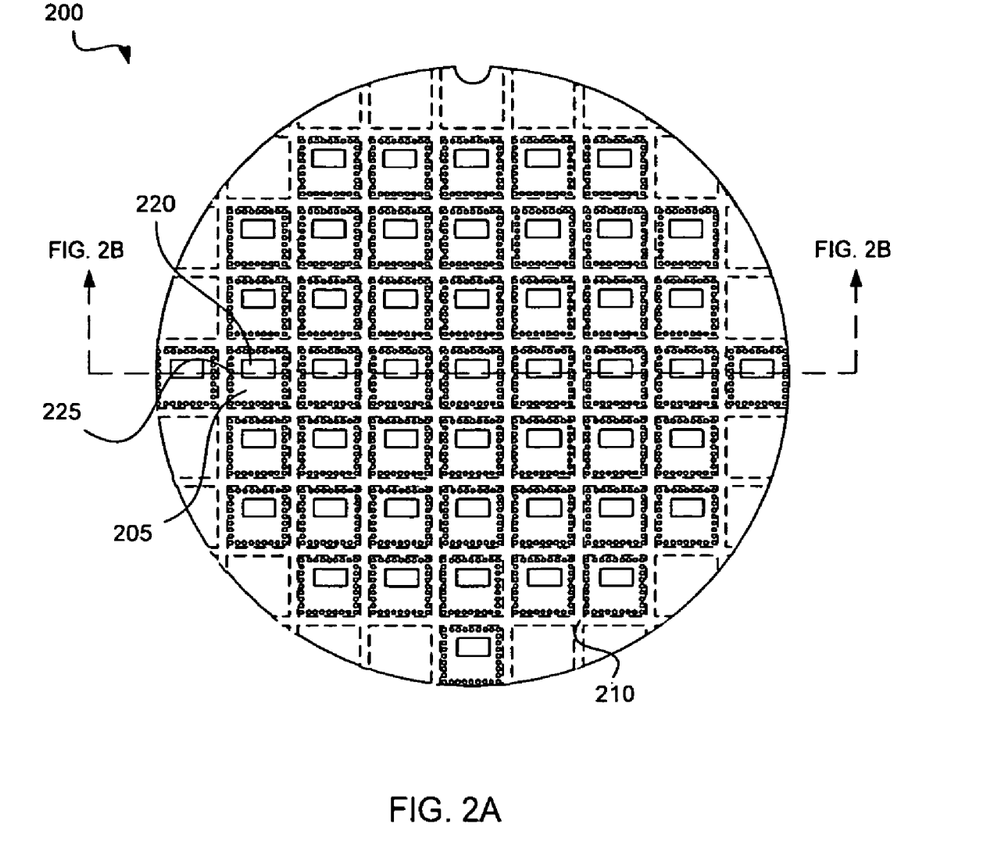
FIG. 2A is a plan view of a semiconductor wafer.
Figure 2B:
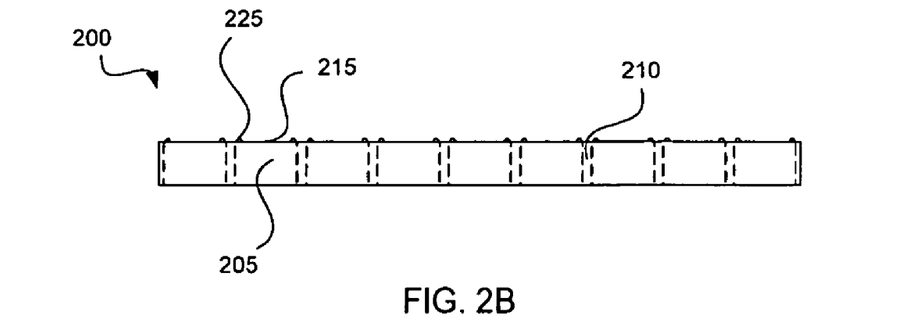
FIG. 2B is a cross sectional view of the semiconductor wafer illustrated in FIG. 2A.

FIG. 2A is a diagrammatic plan view of a typical semiconductor wafer 200 and FIG. 2B is a diagrammatic cross sectional view of the wafer 200. The wafer 200 contains an array of semiconductor dice. Each die 205 is separated from the other dice by saw streets 210, which are where the wafer 200 will be cut during the dicing process. In the illustrated wafer 200, only a relatively small number of dice are shown. However, as will be appreciated by those skilled in the art, state of the art wafers typically include hundreds or thousands of dice on a single wafer.

Figure 7:
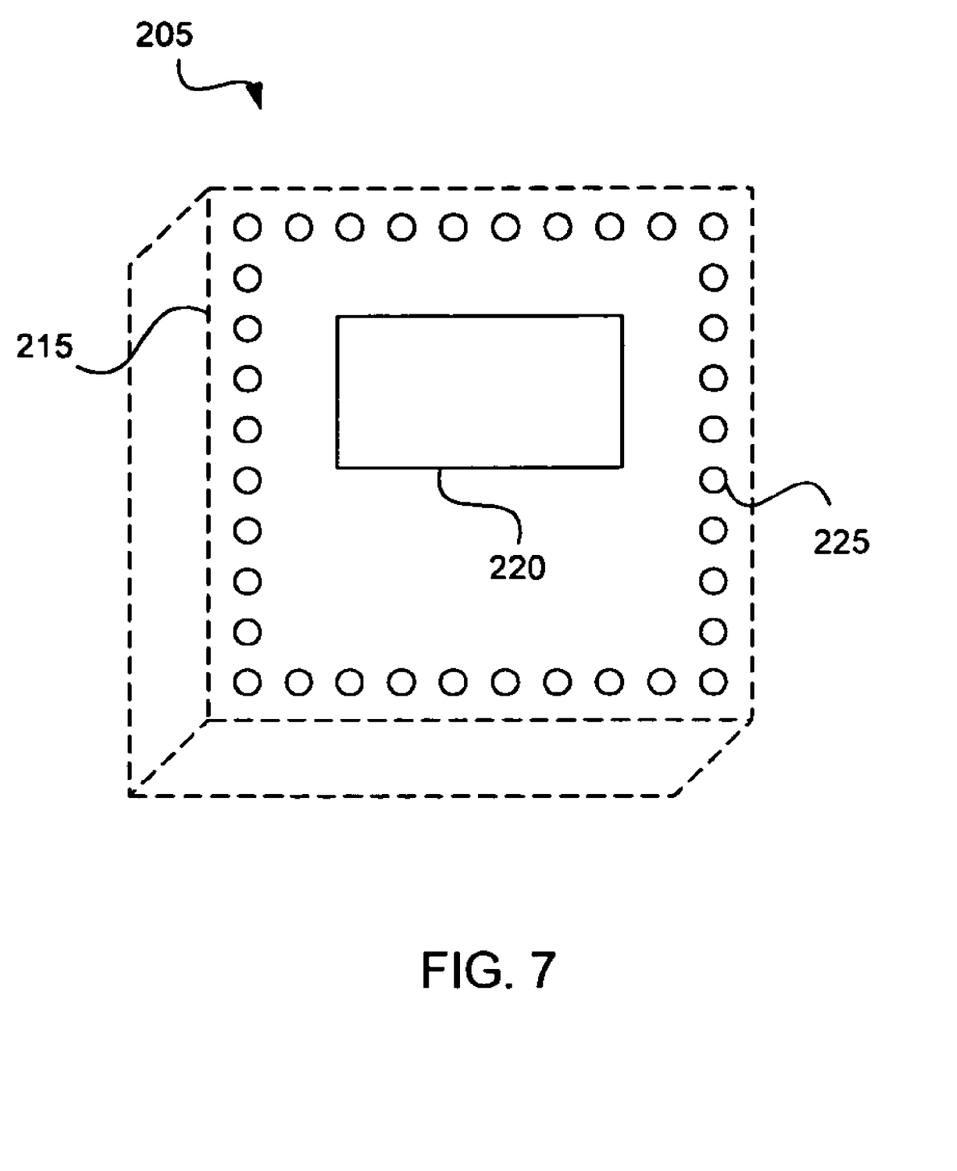
FIG. 7 is a perspective view of a representative singulated die having an imaging array.

For optical circuits, such as CCDs and CMOS imagers, the top surface 215 of the die 205 may include an imaging portion 220 and bonding pads 225. The imagining portion 220 of the die 205 is the light sensitive area. FIG. 7 is a diagrammatic perspective view of a typical imaging die 205. It is usually very important that the imaging portion 220 be unobstructed and remain free of dust particles. A cover can be used to both protect the imaging portion 220 and act as a filter if desired.

Figure 3A:
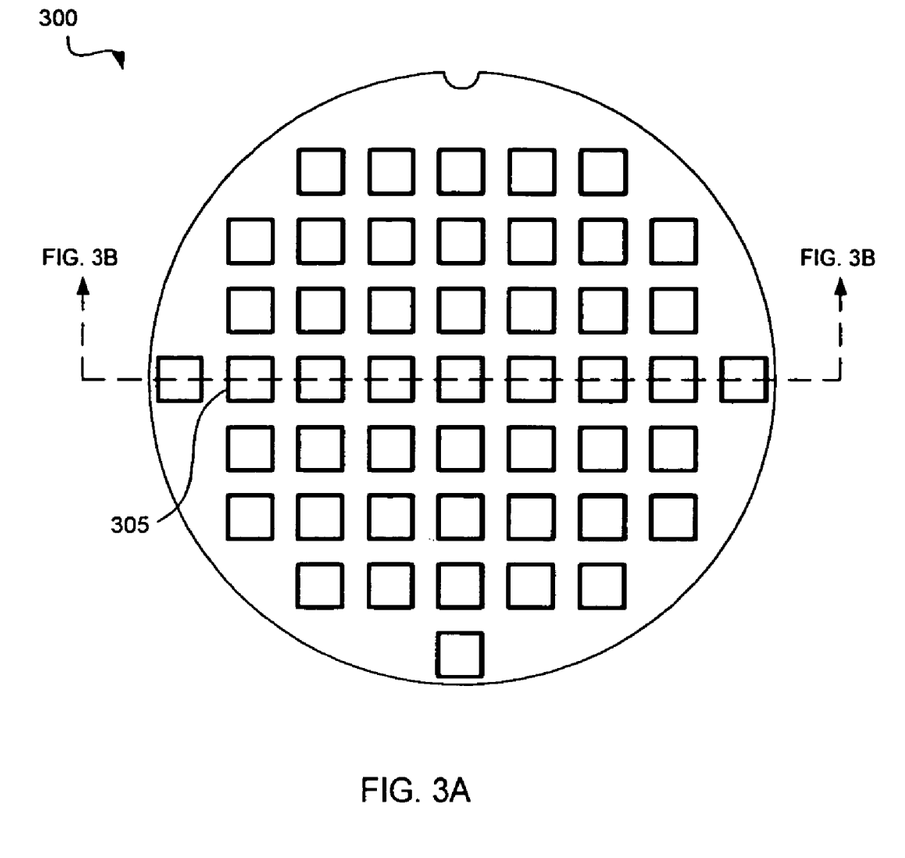
FIG. 3A is a plan view of a cover that can be used in accordance with one embodiment of the present invention to protect dice on a wafer.
Figure 3B:
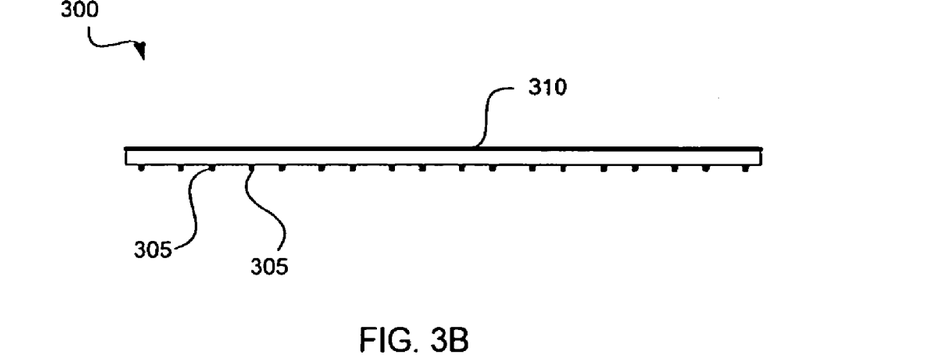
FIG. 3B is a cross sectional view of the cover illustrated in FIG. 3A.

FIG. 3A is a diagrammatic plan view of a cover 300 that can be used to protect the various dice and FIG. 3B is a diagrammatic cross sectional view of the cover 300. Although the cover 300 is shown as having the same size and shape as the wafer 200, it can be of any size and shape that is convenient for the specific fabrication process being used. Additionally, if the die 205 is an optical circuit, the cover 300 cannot be opaque.

Typically, the cover 300 is a sheet of glass. Since glass is susceptible to scratches, a thin protective film 310 can be adhered on its top surface. The film protects the glass sheet during packaging and can then be taken off after the wafer 200 has been diced.

The cover 300 is attached to the wafer 200 with an adhesive 305. A wide variety of adhesives may be used to secure the cover. In the described embodiment, the adhesive is preferably a B-stageable thermosetting resin, such as certain well-known epoxies. B-stage is an intermediate stage in the reaction of certain thermosetting resins in which the material softens when heated, and is plastic and fusible but solidifies when cooled. It is useful to create a structure that is somewhat fixed, but not yet cured (or at least not fully cured). Once a thermosetting resin is cured, its properties are irreversibly changed by chemical reaction. It should be noted that the adhesive 305 does not need to be cured, or even be cureable, as long as it substantially holds it shape while acting as an adhesive.

The adhesive 305 can include fillers that are used to maintain a gap between the cover 300 and the wafer 200. Fillers are well known in the art and are relatively inert substances that are added to a material to alter its physical, mechanical, thermal, electrical, or other properties. Specifically, the fillers may be used with adhesive 305 to maintain a gap between the wafer 200 and the cover 300. Small hollow glass balls are an example of filler that is useful for this purpose. Fillers are only necessary to the extent the adhesive is not capable of maintaining a sufficient gap between the wafer 200 and the cover 300 on its own. The size of the gap will be discussed later.

Figure 8:
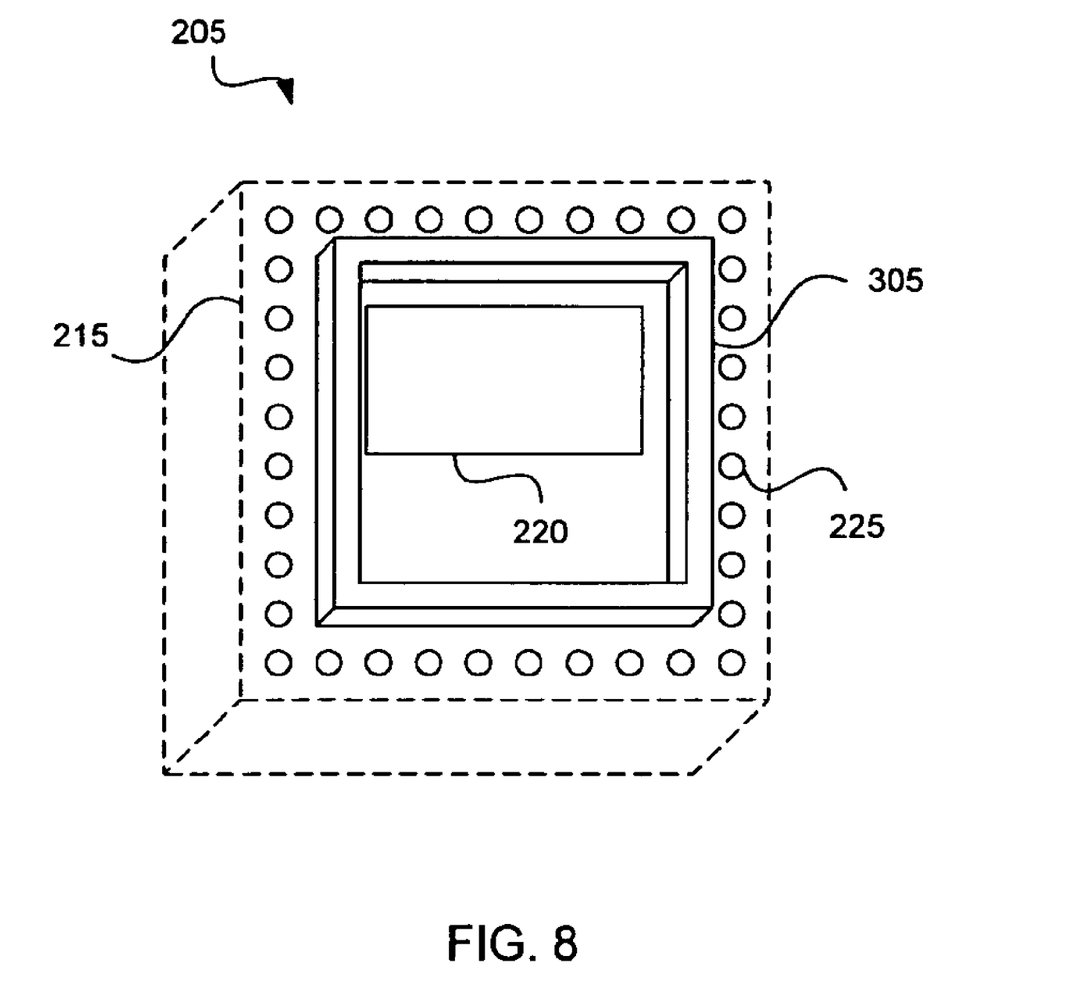
FIG. 8 is a perspective view of a singulated die with an adhesive forming a seal around the perimeter of the imaging array.

As appreciated by those skilled in the art, the adhesive 305 does not need to be applied to the cover 300. Instead, the adhesive 305 can be applied directly to the top surfaces of the dice. FIG. 8 is a diagrammatic perspective view of the die 105 with the adhesive 305 forming a seal around the perimeter of the imaging portion 210 of the optical circuit. The seal can prevent the bottom of the cover 300 from being scratched by loose particles during fabrication.

Figure 4A:
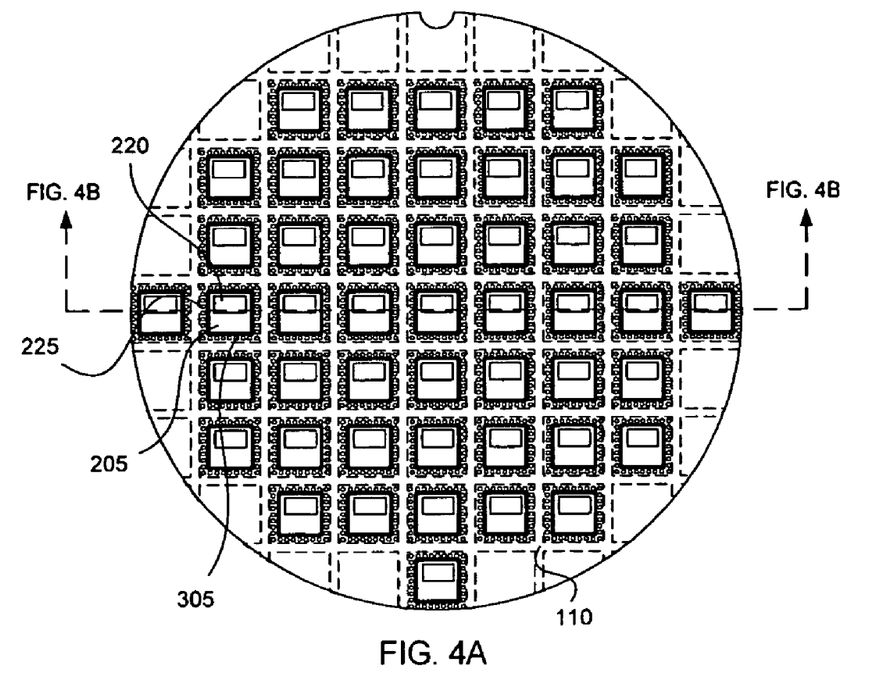
FIG. 4A is a plan view illustrating the cover of FIG. 3 attached to the wafer of FIG. 2.
Figure 4B:
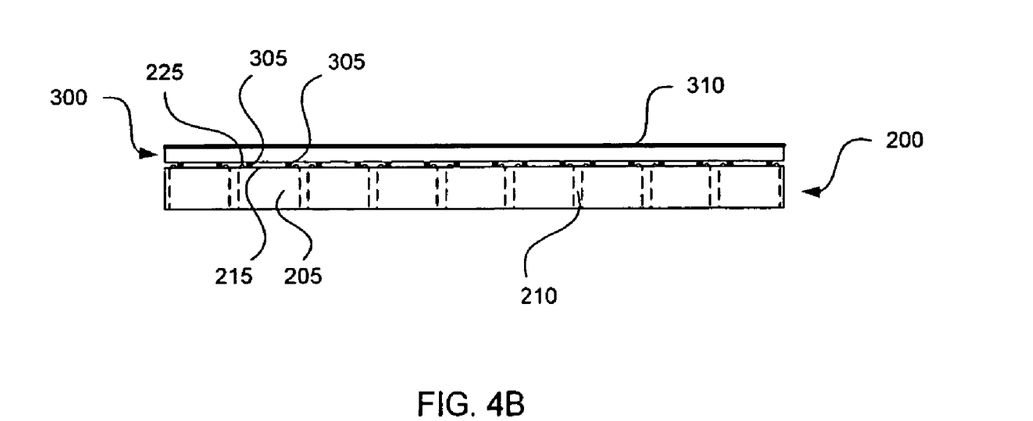
FIG. 4B is a cross sectional view of the covered wafer illustrated in FIG. 4A.

Regardless of whether applied to the cover 300 or the wafer 100, the adhesive 305 is applied substantially between the imaging portion 220 and the bonding pads 225. FIG. 4A is a diagrammatic plan view of the cover 300 attached to the wafer 200 and FIG. 4B is a diagrammatic cross sectional view of the cover 300 attached to the wafer 200. Since most adhesives are not transparent to light, the adhesive 305 will generally not be applied directly on the imaging portion 220. Similarly, it is generally preferable to avoid obstructing the bonding pads 225, although some obstruction can be tolerated as long as the package leads can be connected to the bonding pads 225.

Figure 5:
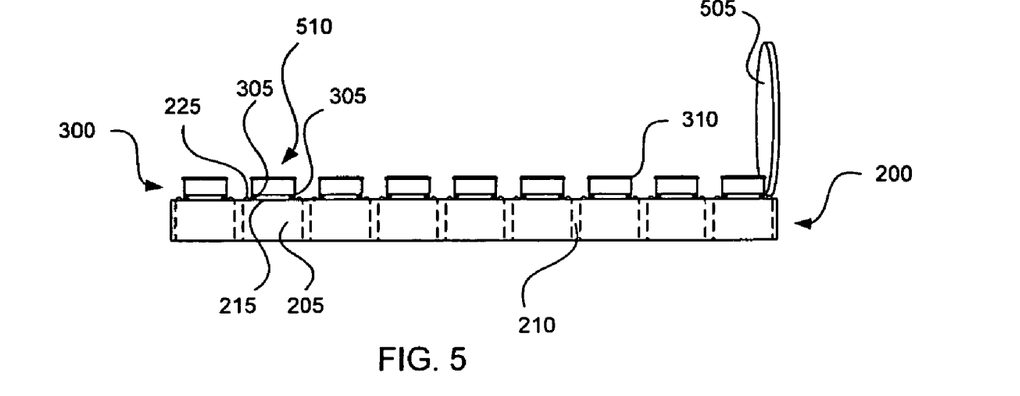
FIG. 5 is a cross sectional view of the covered wafer of FIG. 4 with excess cover material removed.

Similarly, the bonding pads 225 should be substantially unobstructed by the cover 300. Specifically, the cover 300 should not prevent the bonding pads 225 from being capable of electrical contact with a semiconductor package. FIG. 5A is a diagrammatic cross sectional view of the wafer 200 adhered to the cover 300 with the excess cover material removed.

The excess cover material can be removed by any number of standard processes. For example, a double-cut can be employed, cutting on one side of a saw street 210 in one pass and then cutting the other side of the saw street 210 on the next pass. The double-cut method allows a single saw 505 to be used for both cutting the cover 305 and dicing the wafer 200. Alternatively, a saw can be used that is wide enough to cut from one cover of one row of dice to another cover of an adjacent row of dice.

However, the removal process of the excess cover material should not damage the circuitry in the dice. One way to ensure circuitry is not damaged is by using a gap between the wafer 200 and the cover 300. The gap allows a saw to cut the cover 300 without coming into contact with the wafer 200. Therefore, the gap only needs to be as wide as necessary to prevent damage to the circuitry on the dice. Accordingly, the specific fabrication process and saw blades being used will dictate the size of the gap. Once the excess cover material is removed, an individual die cover 510 has an area smaller than the top surface of the die 215 such that the bonding pads 225 are exposed.

Figure 6:
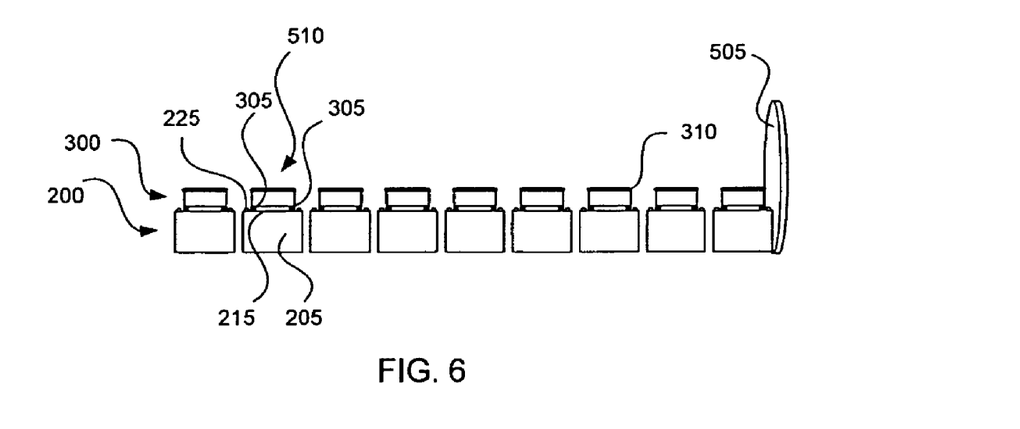
FIG. 6 is a cross sectional view of the covered wafer of FIG. 5 after the wafer has been diced.

After the excess cover material is removed, the wafer 200 can be diced, in accordance with standard fabrication techniques. FIG. 6 is a diagrammatic cross sectional view of the diced wafer 200 that uses the same saw 505 used during excess cover removal.

Figure 9:
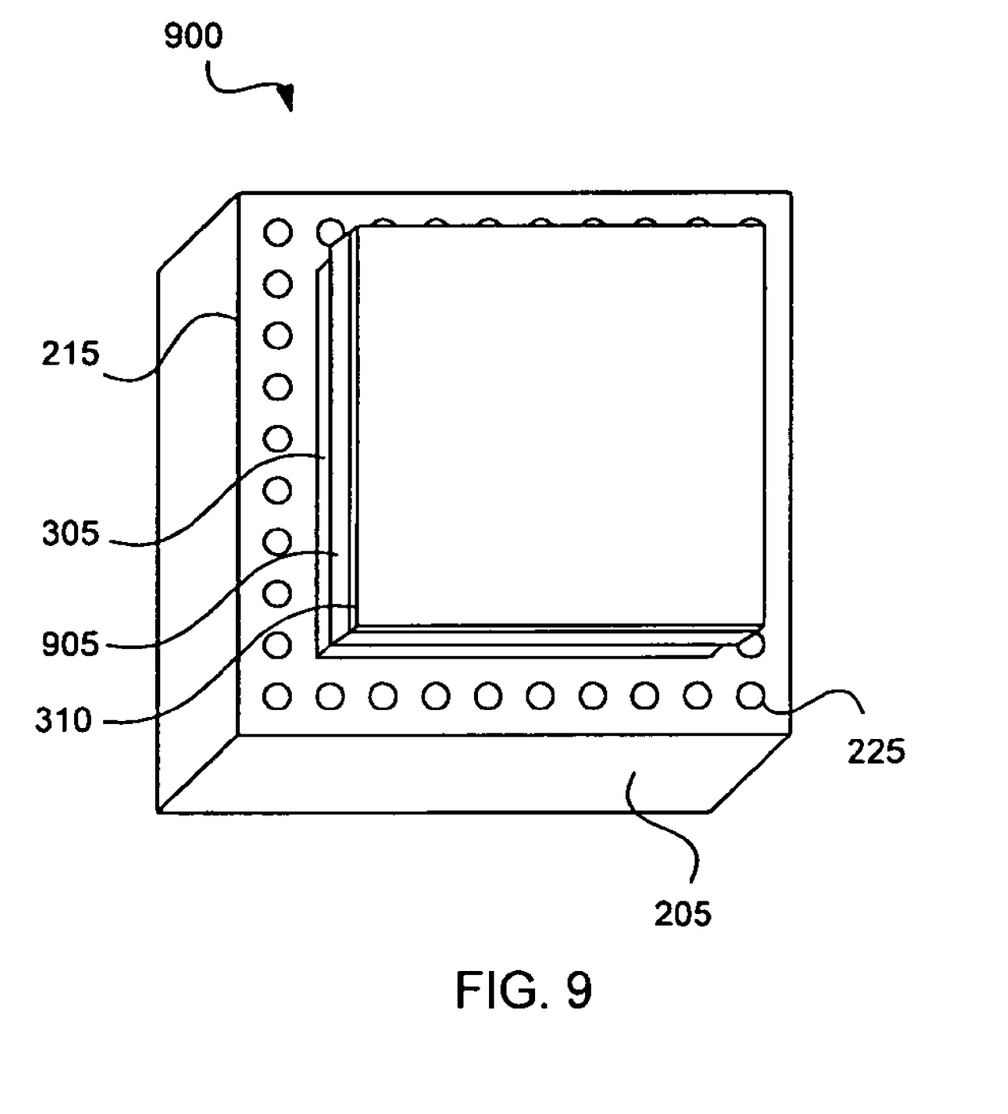
FIG. 9 is a diagrammatic perspective view of an exemplary singulated covered die package in accordance with one embodiment of the present invention.

FIG. 9 is a diagrammatic perspective view of an exemplary covered die 900 that can be packaged in accordance with the present invention. The covered die 900 includes a die 205, a number of bonding pads 225 on the top surface 215 of the die 205, an adhesive 305, a transparent die cover 905, and an optional protective film 310. As will be appreciated by those skilled in the art, the foregoing description does not solely apply to dice that are created using the above-described method, but can apply to similar covered dice that are fabricated by any method.

Figure 10:
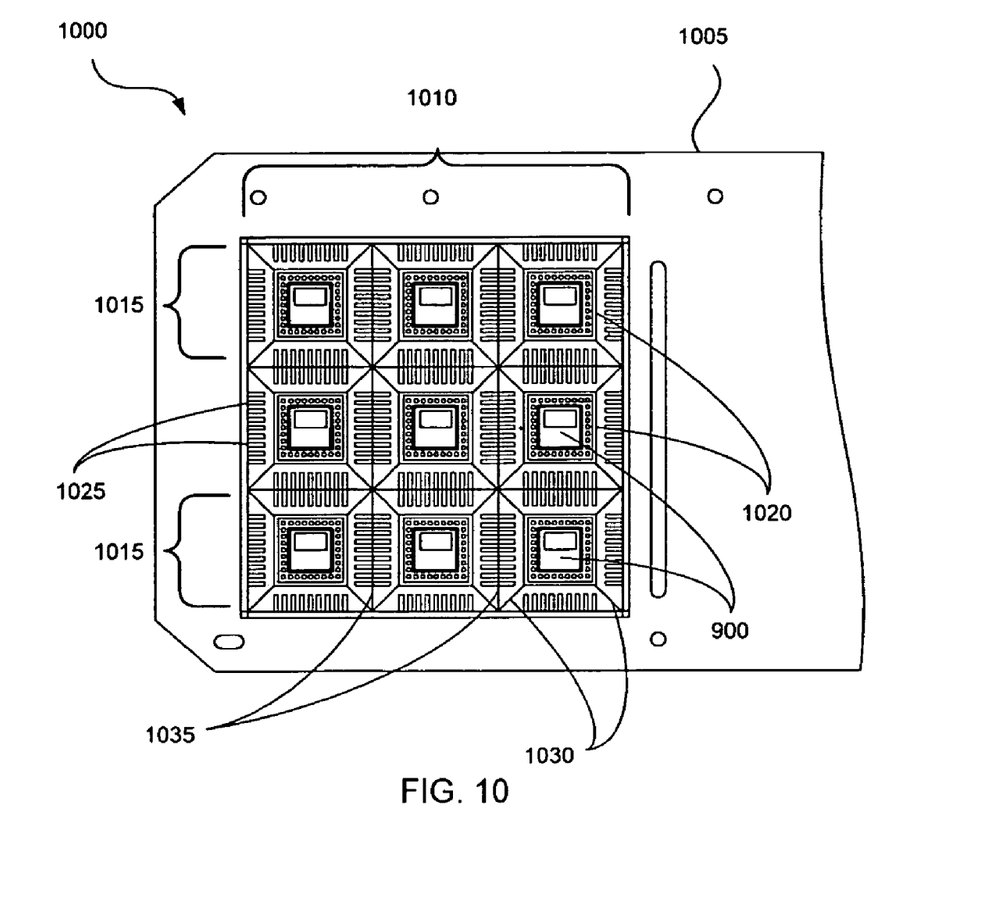
FIG. 10 is a diagrammatic plan view of covered dice attached to a leadless leadframe strip in accordance with one embodiment of the present invention.

FIG. 10 is a diagrammatic plan view of covered dice 900 attached to a leadless leadframe substrate 1000. The leadless leadframe substrate 1000 is a relatively new integrated circuit package design. A copper leadframe strip or panel 1005 is patterned to define a plurality of arrays or matrixes 1010 of semiconductor device areas 1015. Each device area 1015 includes a die attach pad 1020 and a plurality of contacts 1025 disposed about their associated die attach pad 1020. Very fine tie bars 1030 are used to support the die attach pads 1020 and very fine support bars 1035 are used to support the contacts 1025.

Figure 11:
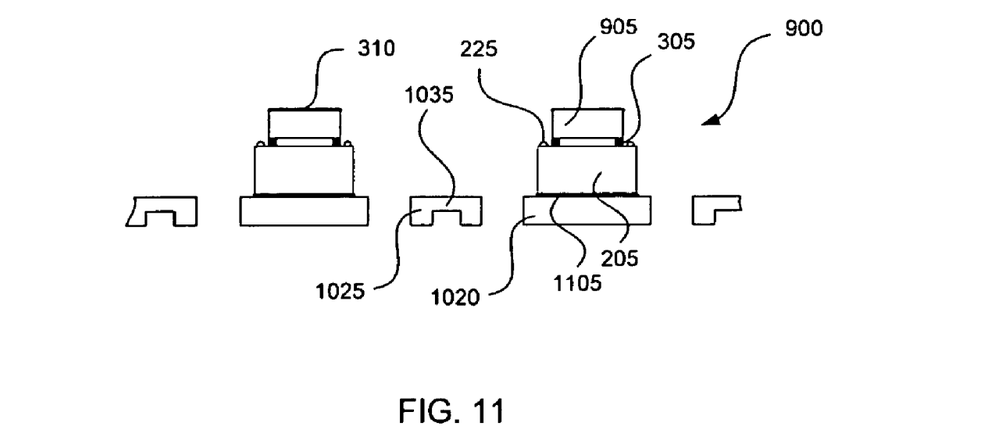
FIG. 11 is a diagrammatic cross sectional view of two device areas from the leadless leadframe strip of FIG. 10.

FIG. 11 is a diagrammatic cross sectional view of two device areas 1015. The covered dice 900 are attached to the die attach pad 1020 via an adhesive 1105. The adhesive can be the same adhesive used to attach the cover 905 to the die 205, or some other available adhesive.

Figure 12:
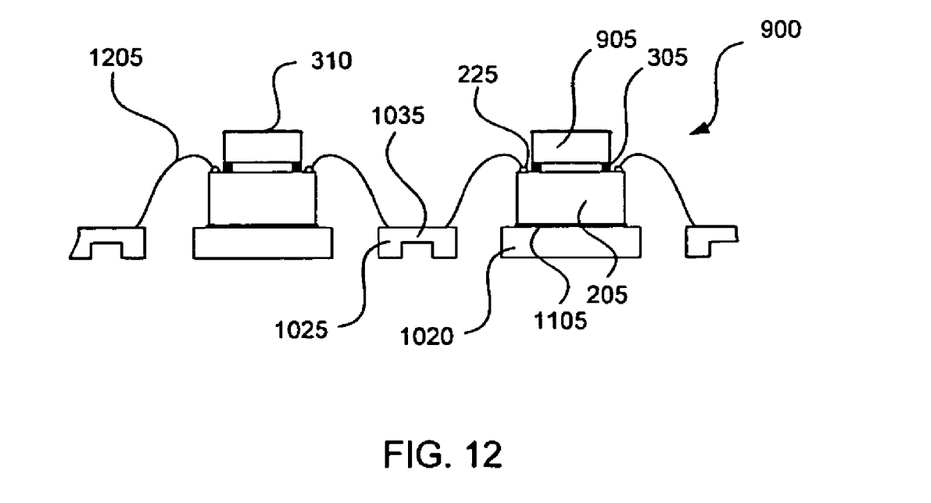
FIG. 12 is a diagrammatic cross sectional view of the two device areas illustrated in FIG. 11 wherein the covered dice have been electrically connected to the lead frame.

FIG. 12 is a diagrammatic cross sectional view of two device areas 1015 that have the covered dice 900 electrically connected to the substrate 1000. Typically, a bonding wire 1205 is used to make the connections between a bonding pad 225 on the die 205 and its associated contact 1025 on the substrate 1000. However, it should be appreciated that other electrical connection techniques can be used to couple the die to the contacts 1025, including direct flip chip mounting, TAB or other suitable mechanisms.

Figure 13:
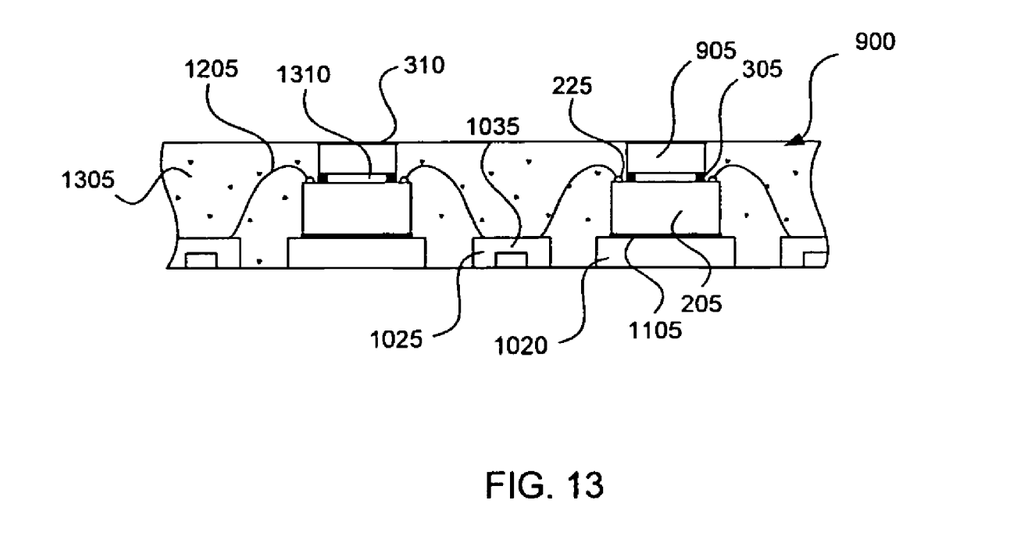
FIG. 13 is a diagrammatic cross sectional view of the two device areas of FIG. 12 after encapsulation.

FIG. 13 is a diagrammatic cross sectional view of two device areas 1015 that are encapsulated. Typically, an opaque plastic is used as an encapsulant 1305. The encapsulant 1305 serves several purposes, including holding the gold wire 1205 in place, protecting the die 205 and ensuring the glass die cover 905 is held in place over the imaging portion 210.

However, since the encapsulant 1305 is typically opaque, the gap 1310 between the glass cover 905 and the die 205 should be kept free of encapsulant 1305. If the adhesive 305 formed the previously described seal around the gap 1310, encapsulant 1305 would not be able to obstruct the imaging portion 210 from beneath the die cover 905. Additionally, by not filling the encapsulant 1305 beyond the height of the die cover 905, the encapsulant 1305 would not obstruct the imaging portion 210 from above the die cover 905 either.

Figure 14:
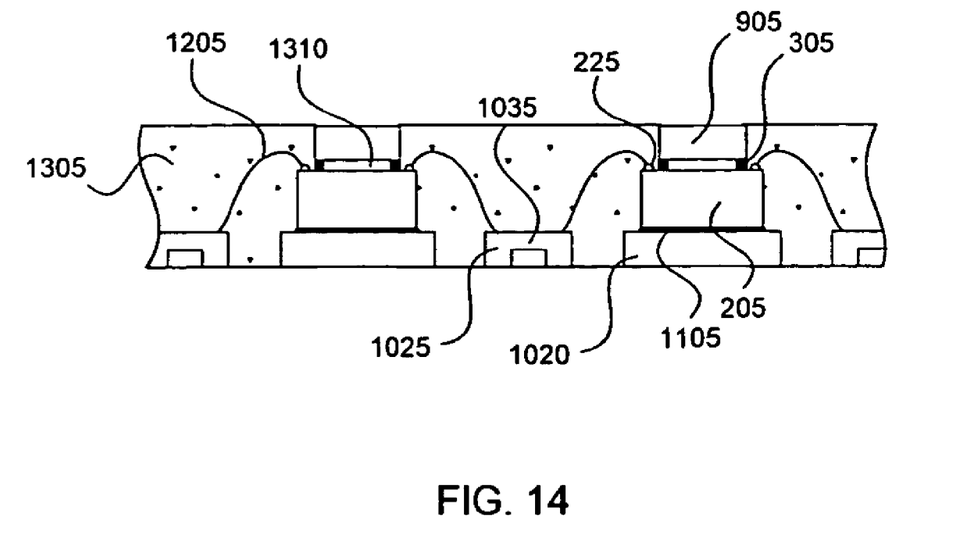
FIG. 14 is a cross sectional view of the two encapsulated device areas of FIG. 13 after the thin protective film has been removed.
Figure 15:
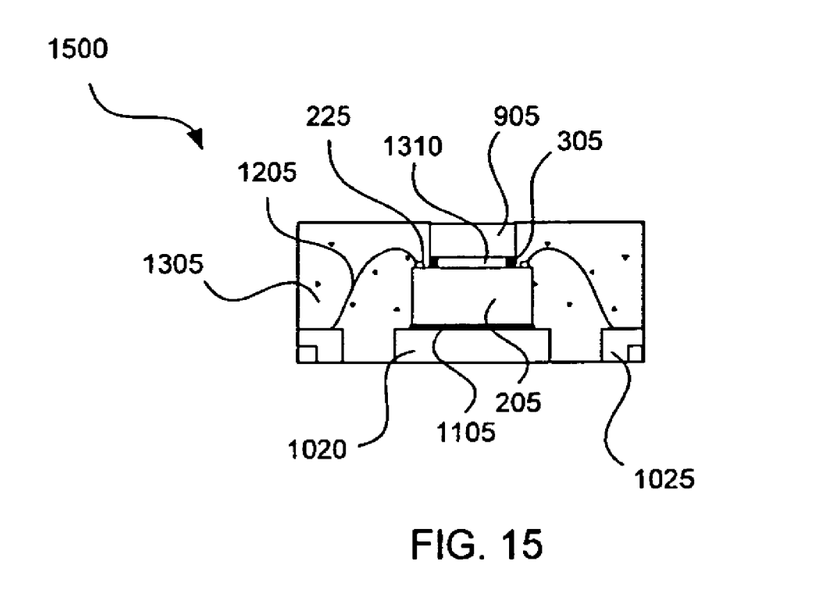
FIG. 15 is a cross sectional view of a singulated package in accordance with an embodiment of the present invention.

FIG. 14 is a diagrammatic cross sectional view of two encapsulated device areas 1015 after the thin protective film 310 has been removed. If the protective film 310 is used, its removal can take place at any point after its benefits are no longer desired. Therefore, it could be removed earlier or later in the process, depending upon the packaging techniques actually used. FIG. 15 is a diagrammatic cross sectional view of the final singulated package 1500.

Although illustrative embodiments and applications of this invention are shown and described herein, many variations and modifications are possible which remain within the concept, scope, and spirit of the invention, and these variations would become clear to those of ordinary skill in the art. For example, many different types of package types can be used, including a ball grid array style packages, quad flat packs (QFPs), dual in-line packages (DIPs) and any of a variety of other substrate or lead frame based package designs. Accordingly, the present embodiments are to be considered as illustrative and not restrictive, and the invention is not to be limited to the details given herein, but may be modified within the scope and equivalents of the appended claims.

What is claimed is:

1. A packaged semiconductor device comprising:
 a die with an imaging portion and a plurality of bond pads on a surface of the die;
 a non-opaque cover positioned above the imaging portion of the die, wherein the non-opaque cover is not positioned above the bond pads to expose the bond pads;
 a substrate positioned below the die, the substrate having contacts that are in electrical contact with the bond pads of the die; and
 an encapsulant that is molded around the die and the non-opaque cover, whereby the encapsulant holds the position of the die relative to the non-opaque cover, wherein a top surface of the non-opaque cover is substantially parallel but slightly recessed relative to a top surface of the encapsulant.

2. The packaged semiconductor device of claim 1 further comprising bonding wires that electrically connect the substrate to the bond pad of the die.

3. The packaged semiconductor device of claim 2 wherein the encapsulant fully encapsulates the bonding wires.

4. The packaged semiconductor device of claim 3 wherein the encapsulant does not obstruct the top surface of the non-opaque cover.

5. The packaged semiconductor device of claim 4 wherein the encapsulant is opaque.

6. The packaged semiconductor device of claim 4 wherein an aperture is formed in the encapsulant above the non-opaque cover, wherein the aperture is formed by placing a protective film on the non-opaque cover during a molding operation.

7. The packaged semiconductor device of claim 1 wherein the non-opaque material is glass.

8. The packaged semiconductor device of claim 1 wherein the substrate is a non-conducive material having electrically conductive traces and contact pads thereon.

9. The packaged semiconductor device of claim 1 wherein the substrate comprises an electrically conductive lead frame.

10. A packaged semiconductor device as recited in claim 9 wherein the lead frame is a leadless lead frame.

11. The packaged semiconductor device of claim 8 wherein the substrate has an array of solder balls thereon and the semiconductor device is packaged as a ball grid array style package.

12. The packaged semiconductor device of claim 1 where the encapsulant is plastic.

13. The packaged semiconductor device of claim 1 wherein comprising a gap between the non-opaque cover and the die.

14. A packaged semiconductor device comprising:
 a lead frame having a die attach pad and a plurality of contacts that are substantially coplanar with the die attach pad such that bottom surfaces of the die attach pad and the contacts are substantially coplanar;

a die having an imaging portion and a plurality of bond pads, the die being mounted on the die attach pad and electrically connected to at least some of the contacts via bonding wires;

an optical cover that overlies the imaging portion of the die but does not overlie the bond pads;

an encapsulant that encapsulates the die and the bonding wires and portions of the lead frame while leaving the bottom surfaces of the die attach pad and contacts exposed at a bottom surface of the packaged semiconductor device, wherein portions of the encapsulant fill gaps between the contacts and between the contacts and the die attach pad such that portions of the encapsulant are exposed on the bottom surface of the packaged semiconductor device and are substantially coplanar with the bottom surface of the packaged semiconductor device, the encapsulant further being arranged to surround edges of the optical cover, while leaving a top surface of the optical cover exposed to permit radiation to access the imaging portion of the die, the encapsulant further being arranged such that a top surface of the optical cover is substantially parallel but slightly recessed relative to a top surface of the encapsulant.

15. A packaged semiconductor device as recited in claim 14 further comprising a removable protective film that covers the top surface of the optical cover, the protective film being substantially coplanar with the top surface of the encapsulant.

16. An arrangement comprising:

a lead frame panel having at least one two dimensional array of device areas, each device area including a die attach pad and a plurality of contacts that are substantially coplanar with the die attach pad such that bottom surfaces of the die attach pad and the contacts are substantially coplanar;

a multiplicity of dice, each die having an imaging portion and a plurality of bond pads, each die being mounted on an associated die attach pad and electrically connected to at least some of the contacts in the associated device area via bonding wires;

a multiplicity of optical covers, each optical cover being arranged to overlie the imaging portion of an associated die but not to overlie the bond pads of the associated die;

a multiplicity of removable protective film, each protective film being positioned over an associated optical cover;

at least one encapsulant cap, each encapsulant cap being arranged to cover an associated two dimensional array of device areas to encapsulate the bonding wires, the dice and portions of the lead frame within the associated two dimensional array of device areas while leaving the bottom surfaces of the die attach pads and contacts exposed at a bottom surface of the lead flame panel, wherein portions of the encapsulant cap fill gaps between the contacts and between the contacts and the die attach pad such that portions of the encapsulant are exposed on the bottom surface of the lead frame panel and are substantially coplanar with the bottom surface of the lead frame panel the encapsulant further being arranged to surround edges of the optical covers within the two dimensional array of device areas without obstruction top surfaces of the optical covers, wherein the protective films are substantially coplanar with a top sure of their associated encapsulant cap.

* * * * *

UNITED STATES PATENT AND TRADEMARK OFFICE
CERTIFICATE OF CORRECTION

| | |
|---|---|
| PATENT NO. | : 7,002,241 B1 |
| APPLICATION NO. | : 10/248725 |
| DATED | : February 21, 2006 |
| INVENTOR(S) | : Mostafazadeh et al. |

It is certified that error appears in the above-identified patent and that said Letters Patent is hereby corrected as shown below:

In the Claims:

In line 1 of claim 12 (column 6, line 58) change "where" to --wherein--.

In line 3 of claim 13 (column 6, line 61) change "wherein comprising" to --further comprising--.

In line 26 of claim 16 (column 8, line 21) change "lead flame" to --lead frame--.

In line 35 of claim 16 (column 8, line 31) change "obstruction" to --obstructing--.

Signed and Sealed this

Twelfth Day of December, 2006

JON W. DUDAS
*Director of the United States Patent and Trademark Office*